United States Patent
Chen et al.

(10) Patent No.: US 6,170,165 B1
(45) Date of Patent: Jan. 9, 2001

(54) METHOD AND APPARATUS FOR MEASURING A GAP

(75) Inventors: Yung-Dar Chen; Jung-Hao Hsiue, both of Hsin-Chu; Shiuh-Shzng Chang, Hsinchu, all of (TW)

(73) Assignee: Taiwan Semiconductor Manufacturing Company, Ltd, Hsin Chu (TW)

( * ) Notice: Under 35 U.S.C. 154(b), the term of this patent shall be extended for 0 days.

(21) Appl. No.: 09/090,431

(22) Filed: Jun. 4, 1998

(51) Int. Cl.[7] ..................................................... G01B 5/14
(52) U.S. Cl. ................................................. 33/832; 33/833
(58) Field of Search ........................... 33/712, 832, 833, 33/834, 613, 549, 555, 629, 551, 553, 554, 502, 567; 248/279.1, 160

(56) References Cited

U.S. PATENT DOCUMENTS

| | | | |
|---|---|---|---|
| 1,521,117 | * 12/1924 | Miller | 33/553 |
| 1,605,784 | * 11/1926 | Schmitt | 33/613 |
| 2,476,239 | * 7/1949 | Duncan | 33/832 |
| 2,965,970 | * 12/1960 | Rocheleau | 33/832 |
| 3,217,418 | * 11/1965 | Wennerberg | 33/832 |
| 3,738,011 | * 6/1973 | Anderson et al. | 33/834 |
| 3,908,278 | * 9/1975 | Sundahl | 33/502 |
| 4,373,267 | * 2/1983 | Lycan | 33/502 |
| 5,012,592 | * 5/1991 | Greenslade | 33/833 |
| 5,125,261 | * 6/1992 | Powley | 73/1.81 |

FOREIGN PATENT DOCUMENTS

| | | | |
|---|---|---|---|
| 2653874 | * 5/1991 | (FR) | 33/832 |
| 31621 | * 10/1970 | (JP) | 33/832 |
| 402051001 | * 2/1990 | (JP) | 33/832 |

* cited by examiner

*Primary Examiner*—Bernard Roskoski
*Assistant Examiner*—Maria Fernandez
(74) *Attorney, Agent, or Firm*—Tung & Associates

(57) ABSTRACT

A method and apparatus for measuring a gap between two opposing surfaces by utilizing a dial gauge instead of feeler gauges is disclosed. The apparatus includes a mounting block, an extension arm and a dial gauge which may be used to measure any gap distance between about 0.01 mm and about 10 mm. The method is carried out by first zeroing the dial gauge by utilizing a calibration block which has the same thickness as the gap distance to be measured. The novel method and apparatus can be used to replace a conventional feeler gauge method and achieve the benefits of greatly improved precision in measurement, a short measurement time required and completely eliminating human error due to operator dependency.

4 Claims, 1 Drawing Sheet

METHOD AND APPARATUS FOR MEASURING A GAP

FIELD OF THE INVENTION

The present invention generally relates to a method and apparatus for measuring a gap between two opposing surfaces and more particularly, relates to a method and apparatus for measuring a gap between two opposing surfaces in a semiconductor process machine of a wafer backside and a knife edge ring by using a dial gauge instead of conventional feeler gauges.

BACKGROUND OF THE INVENTION

In the fabrication process for semiconductor devices, numerous processing steps, i.e., as many as several hundred, must be performed on a semiconducting wafer in order to form the devices. Among the numerous processes, a wafer is frequently positioned on a rotating wafer platform, or a vacuum chuck, for carrying out the specific process. For instance, some of processes are the photoresist coating process, the photoresist developing process and an edge bead rinsing process for removing excess coating.

In a typical photoresist process, a photoresist liquid is first coated onto a wafer by dispensing a small amount of the photoresist liquid at the center of a wafer that rotates at a high speed. Since only a thin coating of the photoresist material is normally required, the amount of the liquid photoresist material dispensed is relatively small. After the photoresist coating process is completed, a wafer can be imaged in a stepper to reproduce the circuits desired on the wafer.

The exposed wafer is then positioned in a second coating chamber wherein a liquid developer material is dispensed on the surface of the wafer by a technique similar to that used in dispensing the photoresist material. A perfectly centered dispensing nozzle for the developing liquid is important to the successful coating of a developing liquid on the wafer surface.

Another important criterion in carrying out a developing process for a photoresist layer is that during the developing process, the backside of the wafer must be protected from being contaminated by the developing liquid. A conventional developing liquid coating apparatus is shown in FIG. 1.

A conventional developing liquid coating apparatus 10 consists of several main components, first, a center vacuum chuck 12 which can be rotated at a high rotational speed by a shaft 14. Onto a top surface 16 of the vacuum chuck 12, a wafer 20 is positioned. The wafer 20 therefore rotates around a center axis 22 of shaft 14. During a developing liquid coating process, a dispensing nozzle (not shown) is centered with axis 22 and positioned very close to the top surface 24 of the wafer 20, i.e., at a distance of only a few millimeters apart. During the spin coating process, the backside 26 of the wafer 20 must be protected from contamination by the developing liquid. A drain cup 30 is provided for catching the excess, or spun-off developing liquid which includes a shield portion 32 and a base portion 34 that are usually formed integrally. The shield portion 32 collects droplets of the spun-off developing liquid such that it drains into cup 30 and is then taken away. The base portion 34 of the drain cup 30 is normally provided with backside rinse nozzles 38 which injects a rinse solution 42 toward the back surface 26 of the wafer 20 to further minimize the probability of contamination by the developing liquid sticking to the backside 26. Additionally, a knife edge ring 40 is utilized for providing a sharp edge 46 forming a seal with the backside 26 of the wafer to stop splattered developing liquid droplets from entering the compartment that houses the vacuum chuck. The knife edge ring 40 is attached to a top surface 36 of the base member 34 with mechanical means such that the gap "X" between the backside 26 of the wafer and the sharp edge, or seal 46 on the knife edge ring 40 can be suitably adjusted.

During a normal developing liquid coating process conducted on an eight inch wafer, a suitable distance of X is maintained at between about 0.5 mm and about 1 mm, and preferably between about 0.6 mm and about 0.8 mm. It should be noted that the drain cup 30 is stationary in relation to a spinning vacuum chuck 14 and wafer 20 carried thereon. Conventionally, the gap X must be adjusted after a preventive maintenance procedure is conducted, or when problem is observed in backside contamination by the developing liquid. FIG. 2 shows a conventional method for adjusting the gap between the backside 26 of the wafer 20 and the seal 46 on the knife edge ring 40. The adjustment is carried out by using a set of feeler gauges including the feeler gauge 50 shown in FIG. 2. After a suitable gap is first determined, e.g., 0.7 mm gap between the backside 26 and the seal 46, a 0.7 mm feeler gauge can be used for adjusting the position of the knife edge ring in relation to the backside of the wafer. Mechanical means such as adjusting screws are used for such purpose. For instance, for a eight inch wafer, a total of 6 adjusting screws are provided for mounting and adjusting the knife edge ring on the base member 34 of the drain cup 30. The screws are normally positioned in equal distance radially to the center axis 22 of the drain cup, or the vacuum chuck and circumferentially from each other.

The gap adjustment between the backside of the wafer and the knife edge ring is important such that the contamination of vacuum chuck by the developing liquid can be avoided. Furthermore, a suitable gap distance between the wafer backside and the knife edge ring at approximately 0.7±0.1 mm must also be maintained. When the gap is too large, contamination of the vacuum chuck by the developing liquid can not be prevented. When the gap is too small, the backside rinse process can not be effectively carried out and furthermore, there may be a danger of scratching the backside of the wafer and causing severe damage.

The use of feeler gauges to measure and adjust the gap distance between the wafer backside and the knife edge ring is difficult and inadequate. Not only it is a time consuming process, the feeler gauge method is also very much operator dependent, i.e., skill-level dependent. For instance, feeler gauge adjustments made by different operators may be different and moreover, adjustments made by the same person at different times may also be different.

It is therefore an object of the present invention to provide a method and apparatus for measuring a gap distance between two opposing surfaces that does not have the drawbacks and shortcomings of the conventional methods and apparatus.

It is another object of the present invention to provide a method and apparatus for measuring a gap distance between two opposing surfaces by utilizing a dial gauge instead of feeler gauges.

It is a further object of the present invention to provide a method and apparatus for measuring a gap between two opposing surfaces by utilizing a dial gauge and a calibration block which has a thickness substantially the same as the gap distance to be measured.

It is another further object of the present invention to provide an apparatus for measuring a gap between two opposing surfaces by mounting a dial gauge on a mounting block and through extension arms such that the dial gauge may first be zeroed by using a calibration block and then be used to measure the deviation from zero of one of the opposing surfaces.

It is still another object of the present invention to provide an apparatus for measuring a gap distance between two opposing surfaces wherein a dial gauge is used which is capable of reading to an accuracy of at least 0.01 mm.

It is yet another object of the present invention to provide an apparatus for measuring a gap distance between two opposing surfaces further including the use of a calibration block which has a thickness substantially similar to the gap to be measured such that the dial gauge may first be zeroed on the block.

It is still another further object of the present invention to provide a method for measuring a gap distance between two opposing surfaces by first providing a measuring apparatus including a mounting block, a shaft extension, and a dial gauge and then zeroing the dial gauge with a calibration block which has a thickness that is substantially the same as the distance to be measured.

It is yet another further object of the present invention to provide a method for measuring a gap distance between two opposing surfaces of a wafer backside and a knife edge ring in a liquid coating chamber by first zeroing a dial gauge with a calibration block having a thickness substantially the same as the gap distance to be measured and then positioning the dial gauge on the surface to be measured such that any deviation from zero on the dial gauge can be read.

SUMMARY OF THE INVENTION

In accordance with the present invention, a method and an apparatus for measuring a gap distance between two opposing surfaces of a top surface and a bottom surface are provided.

In a preferred embodiment, an apparatus for measuring a gap distance between two opposing surfaces is provided which includes a mounting block that has a smooth bottom surface and an aperture in a top surface, a shaft fixably mounted to the aperture at a first end and extending upwardly from the top surface of the block at a second end, an extension arm which has a first end fixably connected to the second end of the shaft and a second end extending horizontally away from the mounting block, and a dial gauge which has a dial and a retractable shaft having a tip for contacting a surface to be measured, the dial is connected to the second end of the extension arm such that the retractable shaft is pointed downwardly toward a surface to be measured.

The dial gauge utilized in the present invention apparatus is capable of reading to an accuracy of at least 0.01 mm. The apparatus may further include a calibration block which has a thickness substantially similar to the gap distance to be measured, and a calibration table on which the mounting block can be securely positioned. The apparatus may further include a calibration block for zeroing the dial gauge on the thickness of the block such that the gauge is ready for measuring a surface and determine its deviation from a gap distance equal to the thickness of the block. The mounting block is adapted for positioning on a wafer chuck such that a gap between a wafer backside and a knife edge ring can be measured.

The present invention is further directed to a method for measuring a gap distance between two opposing surfaces of a top surface and a bottom surface that can be carried out by the operating steps of first providing a measuring apparatus that includes a mounting block, a shaft extending upwardly from the mounting block, an extension arm connected to the shaft at one end and extending horizontally away from the block adapted for connecting to a dial gauge at the other end, the dial gauge is equipped with a retractable shaft for measuring a distance in a direction perpendicular to a top surface of the mounting block, positioning the mounting block of the apparatus on a calibration block which has a thickness substantially the same as the gap distance to be measured, the calibration block is positioned on a surface of a calibration table, zeroing the dial gauge with a free end of the retractable shaft resting on the surface of the calibration table, repositioning the mounting block of the apparatus on a surface which has the same elevation as the bottom surface on which a gap distance is to be measured, positioning the free end of the retractable shaft on the bottom surface, and reading the dial gauge for deviation from the gap distance.

The gap distance measured by the method may be a distance between a wafer backside and a knife edge ring in a liquid coating chamber. The mounting block can be repositioned on a wafer platform such that the retractable shaft of the dial gauge rests on a top surface of a knife edge ring in a liquid coating chamber. The method may further include the step of reading the dial gauge for deviation from the gap distance to an accuracy of at least 0.01 mm. The gap distance measured between the two opposing surfaces may be between about 0.01 mm and about 10 mm. The method may further include the step of removing a top surface of the two opposing surfaces prior to the step of repositioning the mounting block of the apparatus on a surface which has the same elevation as the bottom surface on which a gap distance is to be measured.

BRIEF DESCRIPTION OF THE DRAWINGS

In the drawings, which form an integral part of the specification and the appended claims, and which are to be read in conjunction therewith, and wherein like reference numerals are employed to designate identical components of the various views:

DETAILED DESCRIPTION OF THE PREFERRED EMBODIMENT

The present invention discloses an apparatus and a method for measuring a gap distance between two opposing surfaces by utilizing a dial gauge instead of feeler gauges used conventionally. The present invention apparatus is especially suited for measuring a gap distance between a wafer backside and a knife edge ring in a liquid coating apparatus, however, its application is not limited to only such apparatus. The dial gauge can be used to measure any other gap distance between two closely mated surfaces as long as a top surface can be removed to provide access to the bottom surface.

Figure 1:
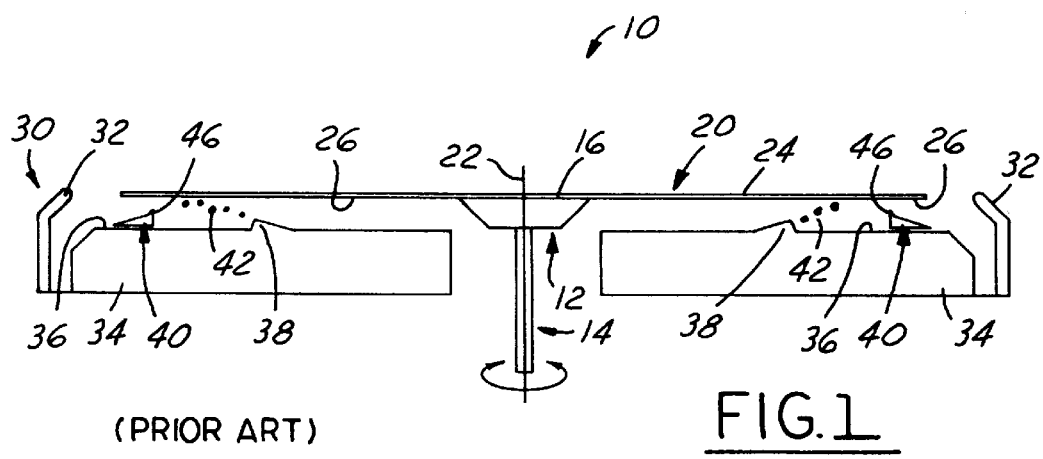
FIG. 1 is a side view of a conventional liquid coating apparatus equipped with a knife edge ring in a drain cup.
Figure 2:
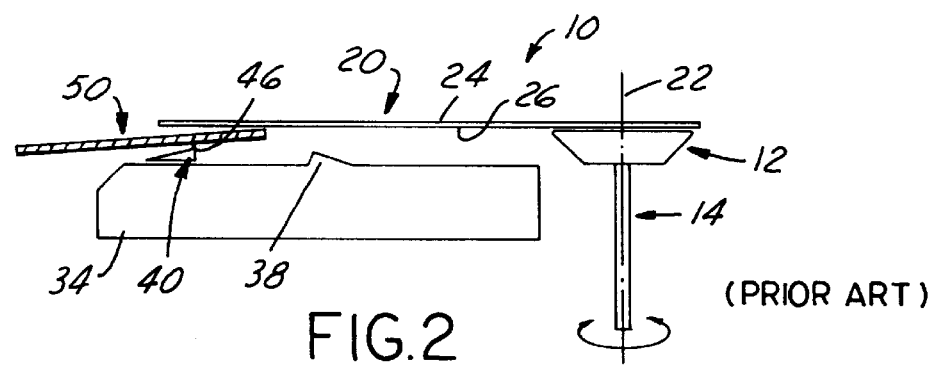
FIG. 2 is a partial, side view of a conventional liquid coating apparatus equipped with a knife edge ring having a feeler gauge inserted therein between a wafer backside and the knife edge ring.
Figure 3:
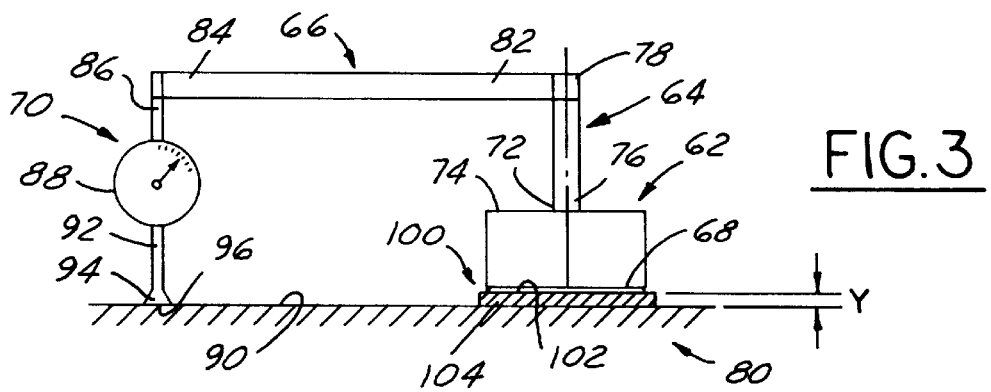
FIG. 3 is a side view of a present invention apparatus with the mounting block positioned on a calibration block.

Referring now to FIG. 3 wherein a present invention apparatus 60 is shown. The present invention apparatus 60 is constructed of a mounting block 62, a vertical shaft 64, a horizontal extension arm 66 and a dial gauge 70. The mounting block 62 has a smooth, leveled bottom surface 68 for engaging a smooth, leveled platform, and an aperture 72 in a top surface 74 of the block 62 for mounting therein a vertical shaft 64. The vertical shaft 64 may also be mounted to the top surface 74 of the mounting block 62 by means other than the aperture 72. The vertical shaft 64 can be fixably or removably mounted to the aperture 72 at a first end 76 such that it extends upwardly from the top surface 74 of the block 62 at a second end 78. An extension arm 66 is provided which has a first end 82 fixably connected to the second end 78 of the vertical shaft 64. A second end 84 of the horizontal extension arm 66 extends horizontally away from the mounting block 62. The length of the horizontal extension arm 66 may be suitably adjusted for a specific application in which a gap distance must be measured. The height of the vertical shaft 64 may be similarly adjusted to suit a specific application.

At the second end 84 of the horizontal extension arm 66, a dial gauge 70 which has a fixed shaft 86, a dial 88 and a retractable shaft 92 is connected. The use of the fixed shaft 86 may not be necessary when the dial 88 is directly connected to the extension arm 66. The retractable shaft 92 is equipped with a tip portion 94 which has a flat bottom surface 96 adapted for contacting a surface to be measured. The dial 88 should have sufficient sensitivity such that it measures to an accuracy of at least 0.01 mm.

FIG. 3 further illustrates a calibration block which is essential to the present invention apparatus and method of measuring gap distance. The calibration block 100 is fabricated of a hard, dimensionally stable material such as steel with a top surface 102 and a bottom surface 104 which are perfectly flat and parallel to each other. The calibration block 100 is supplied in a thickness that is exactly the same as the gap distance to be measured. For instance, in the present illustration for measuring a gap distance between a wafer backside and a knife edge ring, a calibration block having a thickness of 0.7 mm is used.

Figure 4:
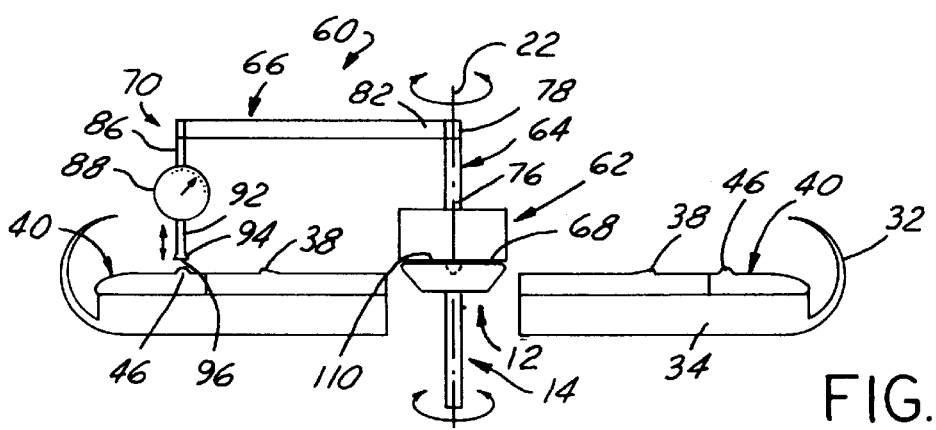
FIG. 4 is a side view of the present invention apparatus positioned in a liquid coating chamber with the mounting block on a vacuum chuck and the dial gauge on a knife edge ring.

The present invention novel method for measuring a gap distance can be carried out in the following manner, as shown in FIGS. 3 and 4. A calibration block 100 having a thickness Y which is exactly the same as the gap distance to be measured is first supplied and positioned on a calibration table 80 which has a perfectly flat top surface 90. The present invention apparatus, with its mounting block 62 is then placed on the calibration block 100 with the dial gauge 70 extended away from the mounting block 62 at a distance of approximately 3~4 inches and the retractable shaft (or probe) 92 pointing downwardly toward the calibration table 80. With the tip portion 94 securely supported by the top surface 90 of the calibration table 80 and the flat surface 96 of the tip portion in intimate contact with the top surface 90, the dial 88 is adjusted to a zero setting. The process may be repeated two or three times at different locations on the calibration table to ensure the accuracy of the zeroing operation.

In the next step of the process, as shown in FIG. 4, the present invention novel apparatus which has a dial gauge zeroed to a calibration block that has the same thickness of the gap distance to be measured is installed in a liquid coating chamber. It should be noted that no wafer is mounted on the vacuum chuck 12 of the liquid coating chamber. As seen in FIG. 4, the mounting block 62 of the present invention apparatus 60 is positioned securely on the vacuum chuck 12 with the bottom surface 68 of the mounting block 62 intimately contacting a top surface 110 of the vacuum chuck 12. The flat surface 96 of the tip portion 94 of the dial gauge 70 contacts the seal 46 of the knife edge ring 40. A gap distance of 0.7 mm can therefore be measured by rotating the vacuum chuck 12 slowly such that the tip 94 of the dial gauge 70 moves on the seal 46 of the knife edge ring 40. Since the dial 88 has been zeroed in the previous calibration step, any deviation from zero on the dial gauge 88 indicates a deviation from the 0.7 mm gap distance. The dial 88 is capable of indicating measurements to an accuracy of 0.01 mm which is sufficient for most applications.

The present invention method and apparatus has therefore been amply demonstrated in the above descriptions and in the appended drawings of FIGS. 3 and 4. It should be noted that while the present invention method has been demonstrated in a photoresist developing solution coating method, the novel apparatus and method can be used to measure any gap distances between any two abutting, opposing surfaces.

While the present invention has been described in an illustrative manner, it should be understood that the terminology used is intended to be in a nature of words of description rather than of limitation.

Furthermore, while the present invention has been described in terms of a preferred embodiment, it is to be appreciated that those skilled in the art will readily apply these teachings to other possible variations of the inventions.

The embodiment of the invention in which an exclusive property or privilege is claimed are defined as follows:

1. An apparatus for measuring a gap between two opposing surfaces comprising:
    a mounting block having smooth top and bottom surfaces that are parallel to each other,
    a shaft mounted to said top surface at a first end of said shaft and extending upwardly from said top surface to a second end of said shaft,
    an extension arm having a first end connected to said second end of the shaft and a second end extending horizontally away from said mounting block,
    a dial gauge having a dial and a retractable shaft with a tip portion for contacting a surface to be measured, said dial being connected to the second end of said extension arm such that said retractable shaft is pointed downwardly toward a surface to be measured, and
    a calibration block having a thickness for zeroing the dial gauge such that the gauge is ready for measuring a surface and determine its deviation from a gap equal to said thickness of the block.

2. An apparatus for measuring a gap between two opposing surfaces according to claim 1, wherein said dial gauge has an accuracy of at least 0.01 mm.

3. An apparatus for measuring a gap between two opposing surfaces according to claim 1 further comprising a calibration block having a thickness substantially similar to the gap to be measured.

4. An apparatus for measuring a gap between two opposing surfaces according to claim 1 further comprising a calibration table on which the mounting block is securely positioned.

* * * * *